United States Patent [19]
Hackstein et al.

[11] Patent Number: 4,886,555
[45] Date of Patent: Dec. 12, 1989

[54] SOLAR CELL

[75] Inventors: Karl-Gerhard Hackstein, Hanau; Rudolf Hezel, Spardorf, both of Fed. Rep. of Germany

[73] Assignee: Nukem GmbH, Hanau, Fed. Rep. of Germany

[21] Appl. No.: 176,286

[22] Filed: Mar. 31, 1988

[30] Foreign Application Priority Data

Apr. 13, 1987 [DE] Fed. Rep. of Germany ....... 3712503

[51] Int. Cl.$^4$ .......................................... H01L 31/06
[52] U.S. Cl. .................................... 136/255; 136/256; 357/30
[58] Field of Search ............ 136/255, 256; 357/30 D, 357/30 J, 30 Q

[56] References Cited

U.S. PATENT DOCUMENTS 4,029,518  6/1977  Matsutani et al. ................... 136/256
4,253,881  3/1981  Hezel ................................... 136/256
4,322,571  3/1982  Stanbery .............................. 136/255
4,367,368  1/1983  Wolf ..................................... 136/255

FOREIGN PATENT DOCUMENTS 2499316  8/1982  France ................................. 136/256

Primary Examiner—Aaron Weisstuch
Attorney, Agent, or Firm—Beveridge, DeGrandi & Weilacher

[57] ABSTRACT

Proposed is a silicon solar cell with a substrate body on one side of which an electrical field is generated by an MIS contact to cause separation of charge carriers generated by radiation energy. The minority charge carriers are drawn off in the metal of the MIS contact, whereas the majority charge carriers are conducted away by ohmic contacts arranged on the opposite side. The ohmic contacts are located on elevated areas relative to the substrate surface. Moreover, the side of the substrate body bearing the ohmic contacts is completely covered with at least one passivation layer.

27 Claims, 3 Drawing Sheets

SOLAR CELL

BACKGROUND OF THE INVENTION

The invention relates to a solar cell, especially to a thin-film solar cell of semiconductive material such as silicon, in whose semiconductive substrate minority and majority charge carriers are generated by radiation energy, said charge carriers being separatable by an electric field and thus dischargeable, with ohmic contacts being arranged at intervals on a (first) semiconductive substrate surface and interlinked, with a passivation layer arranged at least between the ohmic contacts, said passivation layer preferably also covering the ohmic contacts. Furthermore, the invention relates to a method of producing a solar cell.

By structuring an appropriate solar cell, it is possible to reduce recombination of charge carriers in the vicinity of the ohmic contacts without having to generate a potential threshold for minority charge carriers through alloying, diffusion or ion implantation in the semiconductive substrate.

SUMMARY OF THE INVENTION

The object of the present invention is therefore to structure a solar cell of the type described at the outset, such that the thickness of the semiconductive substrate can be significantly reduced without involving the risk of increased recombination in the vicinity of the ohmic contacts. Moreover, in spite of reducing the thickness of the semiconductive material, recombination in the vicinity of the ohmic contacts must be considerably reduced, whereby isolation of the charge carriers from the ohmic contacts must not necessarily be achieved by means of a potential barrier.

The invention solves the task in that the electrical field separating the minority and majority charge carriers flows in the region of a (second) semiconductive substrate surface is located opposite that substrate body surface having the ohmic contact zones, so that the majority charge carriers diffuse to the ohmic contact zones and are collected by them, and that said ohmic contacts are arranged on first zones or areas of the first semiconductive substrate surface, which on the opposite side are elevated in relation to the second zones or areas of the semiconductive substrate existing between the ohmic contacts.

In accordance with the principles of the invention, the ohmic contacts serve to collect the majority charge carriers, and are applied directly onto the substrate material without a doped intermediate film (i.e., without special screening by means of a potential barrier). Due to the absence of a potential barrier, minority charge carriers in addition to majority charge carriers can also always penetrate to the ohmic contacts, although when said minority charge carriers behave ideally relative to the isolating electrical field they should diffuse to the ohmic contacts on the opposite side. However, in order to reduce recombination of majority and minority charge carriers in the region of the ohmic contacts, the invention proposes that the ohmic contacts should be applied elevated e.g., as narrow strips, relative to their surroundings, said surroundings being very well passivated with an insulating lamina. This arrangement ensures that the distance between the ohmic contacts and the opposite side collecting the minority carriers is relatively great, even in the case of very thin semiconductive substrates, and preferably greater than the diffusion length of the minority charge carriers, so that only few minority charge carriers can reach the ohmic contacts (low concentration gradient towards the ohmic contacts). The primary difference in the present state of the art can be recognized herein, even though elevated formation of the ohmic contacts is already known as disclosed in e.g., US-A-4,322,571, US-A 4,367,368 or US-A-4,135,950. However, the ohmic contacts in the solar cells described therein are screened by a potential barrier. The ohmic contacts are not deposited directly onto the semiconductive substrate. Moreover, there is no passivation layer between the ohmic contacts. Finally, according to the state of the art, the ohmic contacts do not have the task of improving the stability of thin-film solar cells, that is cells with a substrate thickness so thin that they would be in danger of fracturing.

In other words, according to the invention, it is proposed that the ohmic contacts be spatially separated from the remaining semiconductive surface, said surface being very well passivated by a passivation layer (insulating lamina). This measure allows the choice outside the ohmic contacts of a semiconductive substrate thickness less than the diffusion length of the minority charge carrier, so that a higher solar cell efficiency can be achieved. Note, however, that the recombination in the vicinity of the ohmic contact is not increased, since in this area the separation distance from the opposite side of the semiconductive substrate is preferably considerably greater than the diffusion length of the minority charge carrier.

Structuring of the semiconductive surface with the ohmic contacts is preferably achieved by selective etching. In doing so one commences with an appropriately thick semiconductive wafer, which is preferably thicker than the diffusion length of the minority charge carrier. This having been done, one defines the ohmic contact areas so as to cover them with a suitable etching mask. The areas not covered by the etching mask are then etched away to leave the required thickness of semiconductive substrate. Insofar as the etching mask is not simultaneously formed by the metal of the ohmic contacts—which point represents a further innovative feature—said etching mask is subsequently removed, so as to apply the metal of the ohmic contact as appropriate. Examples of substances for etching masks are photo-sensitive resist, $SiO_2$ or $Si_3N_4$. It is also possible for the metal to be beneath the etching mask.

The etching agent itself can be of the isotropic or anisotropic, chemical or plasma, ion, reactive ions or laser variety. Anisotropic etching agents are particularly advantageous when a (100)-orientated silicon is used because, as is known, the (100)-surface is etched considerably faster than the (111)-surface. In this case underneath the etching mask are the trapezoidal section areas with an edge angle of 54.7°. The ohmic contacts are then mounted on the peaks, i.e., the outer faces of these areas. Worthy of particular consideration as anisotropic etching agents are the known structure etchers on the basis of, e.g., potassium hydroxide or ethylene diamine. It is also possible to make advantageous use of (110)-surfaces in conjunction with anisotropic etchers, whereby elevated areas defined by perpendicular walls are produced. A rectangular cross-section results.

As previously mentioned, as proposed in the invention, the ohmic contacts serve simultaneously as etching masks. Simultaneously with the etching procedure, the uncovered areas are textured to enhance the penetration of light into the Si surface passivated with the insulating lamina.

With respect to the metals used in the actual ohmic contact, it must be noted that these can be applied, e.g., by thermal vapour depositing in a vacuum through a mechanical mask, by screen printing, through cathode sputtering, and structured by photolithographic means if required.

The areas elevated for the ohmic contacts additionally provide an advantage in that they increase the strength of the semiconductive substrate without the risk of susceptibility to fracture, even though the film thickness is certainly small between the elevated portions. This factor plays a big role particularly when an inexpensive single- and polycrystalline ('solar grade') silicon material with a short diffusion length is used for the minority charge carriers.

This allows, amongst other things, this material to also exploit the radiation impinging on the rear of the solar cell.

A further advantage embodied in the form of the solar cell of the invention is that contacting thin solar cells, for example by ultrasonic welding, is made substantially easier in that it is done on the thick semiconductive area covered by the ohmic contacts, or else on an additional contact area consisting of thick semiconductive material formed on the edge simultaneously with the etching of the ohmic contact zone, and without the risk of any breakage in the thin silicon areas. Furthermore, this arrangement with a passivation layer extending beyond the lateral edge of the solar cell allows the front-surface contact to be led over the edge to the rear where it is contacted. Contacting both connections on one side, e.g., by ultrasonic welding, considerably simplifies the production process.

The solar cell construction proposed in the invention can be used for single- and polycrystalline silicon as well as for compound semiconductors.

Further details of the invention can be seen from the claims, and from the features to be found therein individually and/or in combination.

BRIEF DESCRIPTION OF THE DRAWINGS

Further details, advantages and features of the invention can be seen from the following description of preferred designs as illustrated in the drawing.

The illustrations show the following.

DETAILED DESCRIPTION OF THE PREFERRED EMBODIMENTS

Figure 1:
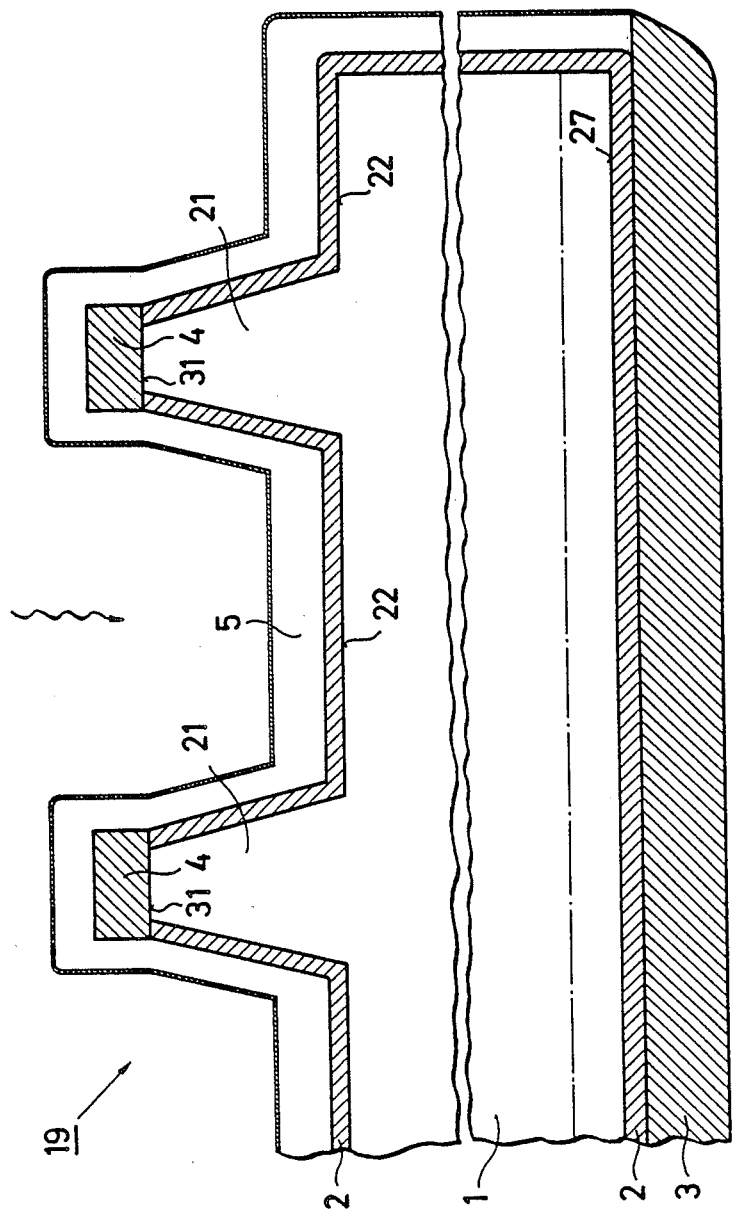
FIG. 1 shows a first embodiment of a silicon solar cell according to the invention having ohmic contacts on the front surface.

FIG. 1 illustrates an embodiment of solar cell (19) constructed according to the invention, said solar cell comprising a p-doped silicon substrate as the body (1), a thin silicon oxide layer (2), ohmic contacts (4) and an MIS (metal-insulator-semiconductor) contact consisting of the p-silicon of the silicon body (1), the silicon oxide layer (2) and the metallized layer (3) preferably of aluminum or magnesium or a double layer of Mg/Al.

The ohmic contacts (4) are discontinuously arranged on the semiconductive substrate (1) whereby, according to the invention, said contacts are arranged on the exposed front surfaces (31) of elevations (21). Said arrangement ensures that the distance between the ohmic contacts and the opposite side (27) of the semiconductive substrate (1) is greater than in the remaining surface area of the semiconductive substrate (1), said surface area being designated (22) in the drawing. Together with the underlying elevated silicon zones (21), the ohmic contacts (4) can form a geometric pattern described as interconnected strips, rings or dots. In other words, the silicon zones (21) with the ohmic contacts (4) could exhibit a comb, grid or ring structure when viewed in plan. Thereby, the ring structure could be formed by concentric rings with radially running paths.

Passivation layers extend between the elevated ohmic contact zones (4), being composed on the one hand of the silicon oxide layer (2) grown naturally or else generated below 800° C., and a further insulating lamina (5), which can serve as a passivation layer and as an anti-reflection layer. The thickness of the upper, designated the first passivation layer (5) can thereby be approx. 80 nm, and comprises preferably of aluminium oxide or silicon nitride. The further insulating lamina, designated the second passivation layer, in the form of the silicon oxide layer (2), can be built up differently on the front and rear surfaces of the silicon substrate (1). It is therefore possible to vary the thickness within wide limits, since said layer does not act as a tunnel insulator. It is naturally also possible to dispense with said layer completely.

Both the natural silicon oxide layer and a silicon oxide layer (2), specially prepared for example by thermal or other oxidation methods, can be used for interfacial passivation. By natural silicon oxide layer is meant that film which is always present on the silicon substrate (1) and which is only a few atom layers thick.

The structural composition of the silicon oxide layer (2) itself can be changed on the front surface by the subsequent deposition of the first passivation layer (5), e.g., silicon nitride. A conversion of silicon oxide into silicon oxynitride is therefore possible, for example.

Unlike in conventional solar cells, the charge carriers primarily generated near the front by the incident light must first diffuse through the whole substrate (1), so as to be collected by the MIS contact on the rear. It is hereby extremely important for the front side, comprising the silicon surface in the zones around the ohmic contacts (4) and those covered by the passivation layers (2) and (5), to have a low surface recombination speed, since otherwise a large proportion of the charge carriers will prematurely recombine there.

According to the invention, a silicon etching process effectively elevates the ohmic contacts (4) above the top surface, thereby eliminating their recombination flow to a greater or lesser extent according to the height the zones. This is because this measure considerably increases the distance of the ohmic contacts (4) both from the point at which the charge carriers are generated in the silicon volumes (1) and from the collecting MIS contact (3), so that as a result of the now increased concentration gradient the minority charge carriers diffuse in preference to the MIS contact where they are utilized. For reasons of advantage, the distance from the ohmic contacts (4) (surface (31)) to the MIS contact (3) on the opposite side (surface (27)) should be greater than the diffusion length of the minority charge carriers. The thickness of the silicon substrate (1) in area (22) can be greater, equal to or smaller than the diffusion length, but preferably substantially smaller. However, insofar as the thickness is indeed substantially smaller than the diffusion length, as many as possible of the minority charge carriers generated on the front surface can diffuse to the rear surface without recombining.

According to the invention, this optimization of the substrate thickness and the height of the ohmic contact zones can be achieved independently from one another through suitable choice of the initial thickness of the silicon layer and through the duration of the etching process. A further advantage results from the elevated silicon ridges (21) below the ohmic contacts (4) serving as mechanical reinforcement for the silicon mass (1). Said mass must be as thin as possible (down to 10 μm) in order to ensure high efficiency, particularly for cheap solar silicon (short diffusion length); said arrangement not being achievable without the mechanically strong ohmic contact zone, at least not over large areas. Said arrangement makes possible the production of solar cells on extremely thin silicon, including on a large industrial scale. Furthermore, texturing of the silicon surface to increase the incident light can be done simultaneously with the etching process (anisotropic etching).

The ohmic contacts (4) are preferably arranged in the form of fingers, i.e., they comprise ridges running in parallel to one another, and linked on one side (comb-form). The distances between the ohmic contact fingers must be significantly greater than the thickness 'd' (distance between surfaces (22) and (27)) of the silicon substrate (1) and the diffusion length of the minority charge carriers, so that the mean path to the collecting MIS contact is less than to the ohmic contact zone. The maximum distance between the ohmic contacts (4) is limited by the series resistance. The optimum distance is in the range from 1 to 5 mm, the finger width in the range 50 to 300 μm, thereby achieving a contact surface proportion or shading effect of less than 10%.

The rear surface metal (3) of the MIS contact serves as a reflector for the unabsorbed light, thereby considerably increasing both the light path in the silicon and the generation of charge carriers, which feature particularly facilitates advantageous utilization of very thin, inexpensive solar silicon. Moreover, reflection of the infra-red component of the sunlight on the rear leads to less heating of the solar cell, and consequently to higher efficiency under real operating conditions. With respect to the elevated silicon zones (21), it should be mentioned that their cross-sections could be trapezoidal, rectangular or curved.

Figure 2:
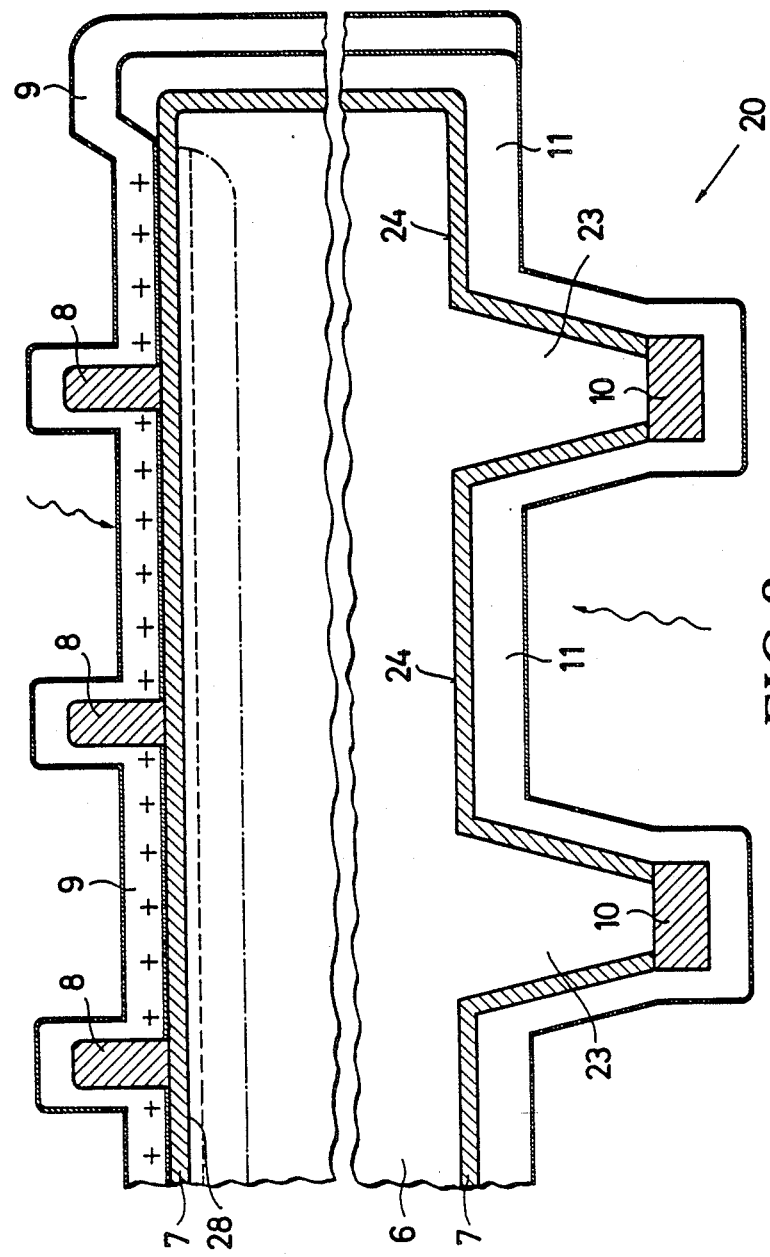
FIG. 2 shows a silicon solar cell having ohmic contacts on the rear surface.
Figure 3:
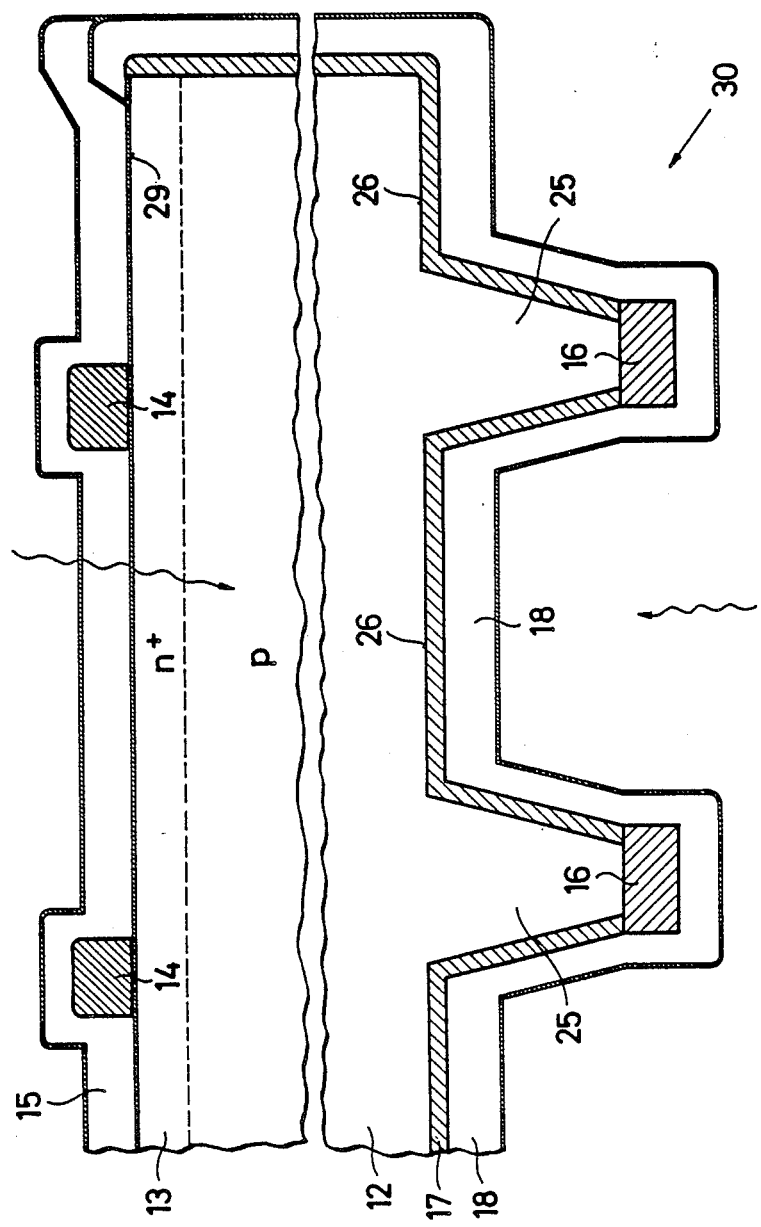
FIG. 3 shows a further embodiment of a silicon solar cell having ohmic contacts on the rear surface.

FIGS. 2 and 3 illustrate further embodiments of solar cells (20) and (30) respectively, that comply with the principles of the invention. In both cases the ohmic contact (10) or (16) respectively is arranged on the rear surface of solar cell (20) or (30), and directly on the semiconductive substrate body (6) or (12) and likewise in certain areas, as was the case in FIG. 1.

The solar cell shown in FIG. 2 corresponds to the basic design principle of the silicon nitride inversion-layer solar cell with MIS contacts described in DE-PS 28 40 096. The solar cell (20) thus has a p-doped silicon substrate or body (6) upon which is arranged a thin silicon oxide layer (7). Arranged on the front surface are MIS contacts comprising the semiconductive substrate (6), the silicon oxide layer (7) and discontinuous metal layers (8) preferably arranged in strips. A further insulating layer (9), preferably comprising silicon nitride, extends over the surface comprising the areas of silicon oxide layer (7) and the metal strips (8). A stationary positive surface charge, comprising the natural charges and those introduced by foreign ions, must be located in said silicon nitride layer (9) on the nitride-oxide junction; said charge induces on the surface of the p-doped silicon substrate (6) an inversion layer comprising electrons. The electrons (minority charge carriers) generated by the light diffuse towards the front where they are accelerated in the electrical field generated by the positive insulator charges, and travel along the highly conductive inversion layer to the MIS contacts, through which they leave the silicon body (6) and pass into an external circuit. The majority charge carriers, i.e., holes in the p-doped silicon body (6), diffuse towards the ohmic contacts (10).

Further provided is an additional passivation layer (11) also covering the ohmic contacts (10). As the decisive feature, attention is drawn to the elevated arrangement of the ohmic contacts (10), i.e., to the projections (23) preferably in strip form elevated relative to the normal top surface (24), said projections being formed by a silicon etching process. This arrangement strongly reduces the influence of the ohmic contacts (10) on recombination of the charge carriers, and completely eliminates it where the distances from the points of origin are considerably greater than the diffusion length. This in turn allows the actual silicon substrate (6) to be made thinner without increasing recombination, thereby substantially increasing the level of efficiency relative to the incident light both from the front and from the rear.

Of particular significance here too is the decisive advantage that the mechanical strength of the thin silicon substrate (6) is considerably enhanced by the silicon elevations or bracing ridges (23) beneath the ohmic contacts (10); said advantage therefore enabling for the first time the economic production of high-efficiency extremely thin (d ~ 50 μm) silicon solar cells, which can be illuminated from both sides. It must be particularly noted that the above can be achieved essentially without more technical effort.

In this case also, use of an anisotropic etching medium and (100)- or (110)-orientated silicon, makes it possible to texture the rear surface at the same time as etching the contact zones (10). The spaces between the MIS contacts on the front side (50 μm-1 mm) are substantially less than the spaces between the ohmic contacts (10) on the rear (1 mm-5 mm). The distance between the MIS contacts could be 1/50th of the distance between the ohmic contacts (10).

The preferred materials for passivating the rear with the transparent passivation or insulating lamina (11) are silicon nitride or silicon oxynitride (produced in plasma), or aluminum oxide or aluminum oxynitride, as the case may be. The manufacturing temperatures lie between 300° C. and 600° C. The function of these layers on the rear side is, however, completely different to those on the front side. In the latter case, high positive charges must be present on the junction to ensure that a highly conductive inversion layer (electron gas) is generated close under the top surface. In contrast, on the rear side the surface recombination speed must be severely reduced; a highly conductive inversion layer here tends to be adverse, since the minority charge carriers then flow to the ohmic contacts where they recombine and lose their utility. The rear silicon nitride layer (11) is produced at higher temperatures in comparison with the nitride layer (9) on the front side. It is nevertheless advantageous to also enhance the positive charge density in the rear nitride layer (11) by incorporating foreign ions (especially alkali ions), since this does not reduce the density of the surface states but rather their electrical activity as centers of recombination. Thus in this manner, as well as reducing the hydrogen passivation which occurs during nitride deposition or post-treatment by heat, one also reduces the surface recombination. In doing so, one also accepts the inversion layer resulting from the high charge densities and the sharply increased conductivity in said layer.

However, the present invention with the ohmic contacts (10) cut back by etching also very considerably reduces the adverse effect of the inversion layer in that, with constant spacing between the ohmic contacts, the length of the inversion layer and thus their resistance are both significantly increased bringing with it a sharp reduction in the flow of minority charge carriers to the ohmic contacts. In this respect, this improved arrangement of the ohmic contacts (10) on the rear permits further reduction in the recombination through higher insulator charge densities, without having to accept the additional disadvantage relating to the inversion layer. This advantage also applies to the solar cell illustrated in FIG. 1 with the elevated ohmic contact grid on the front side. Aluminum oxide as insulating lamina (11) contains negative charges, which on p-doped silicon lead to a greater concentration of holes on the silicon surface. Advantageously the problem with the inversion layer does not occur here at all, the electrons as minority charge carriers being rejected from the rear surface by the potential barrier.

If one does not wish to exploit the incident light on the rear surface, the option then exists of applying a highly reflective metal (e.g., Al, Ag), for instance, by vacuum deposition or cathode sputtering, on the transparent insulating lamina (11) over the complete rear side. The effect is to double by reflection the path of the front incident light in the silicon, and so increase the level of efficiency especially in thin, inexpensive solar silicon.

A solar cell (30) in accordance with the principles of the invention is shown in FIG. 3; said solar cell can be a conventional n+p or else a p+n solar cell.

The n+p solar cell (30) illustrated in the embodiment comprises a semiconductive substrate (12), a highly doped surface layer (13) (here n+), a non-areal ohmic contact (14) in grid form and a front-surface anti-reflection layer (15). Ohmic contacts (16), also not arranged over the entire surface and preferably in ridge or grid form, are located on the rear surface, as are passivation layers preferably in the form of a silicon oxide layer (17) and an insulating layer (18) doubling as an anti-reflection layer. Said insulating layer (18) is preferably made of aluminum oxide or silicon nitride. The formation of an n+p solar cell (30) on the rear surface, a solar cell designed for illumination from both sides is provided in a simple manner, with the additional advantage that the long-wave heat radiation escapes from the cell (30) so that the operating temperature drops (increase in open circuit voltage). In accordance with the invention, the ohmic contacts (16) are now arranged in the form of fingers on elevations (25) effectively raised from surface (26) by silicon etching. The ohmic contacts (16) are covered by the passivating layer (18).

Formation of the solar cell (30) in accordance with the invention achieves the same advantages as with solar cell (20) in FIG. 2. However, there is a difference between the two cells (20) and (30) in the fact that solar cell (30) with a p-n junction incorporates high-temperature processes, whereas the complete solar cell (20) is manufactured by using simple low-temperature processes. Both cells can exploit sunlight incident on the front surface as well as on the rear surface. A reflecting metal coating can be applied to the rear surface as an option.

The features described in the aforegoing naturally also apply in the case of solar cells with n-doped semiconductive substrates.

We claim:

1. A solar cell comprising:
    a semiconductive substrate having first and second opposed major surfaces in which minority and majority charge carriers are generated by radiation energy, said charge carriers being separable and so dischargeable by an electrical field,
    ohmic contacts arranged at intervals upon said first semiconductive substrate surface, said contacts being interlinked with one another, and
    a passivation layer arranged at least between said ohmic contacts, and wherein
    the electrical field separating the minority and majority charge carriers exists in the vicinity of said second semiconductive substrate surface positioned opposite said first semiconductive surface carrying said ohmic contacts, so that the majority charge carriers diffuse to said ohmic contacts which collect said charge carriers,
    said ohmic contacts are arranged in first areas on said first semiconductive substrate surface, said first areas being elevated with respect to second areas which are located between said ohmic contacts,
    said ohmic contacts are in direct contact with said semiconductive substrate without shielding means, provided by doping said semiconductor substrate in its first surface region, for shielding against the minority charge carriers by a potential barrier,
    said second areas do not have a potential barrier against minority charge carriers provided by doping of said semiconductor substrate in its first surface region, and
    said ohmic contacts are covered by the passivation layer.

2. A solar cell according to claim 1, wherein the electrical field separating the minority and majority charge carriers is generated by MIS contacts formed on said second substrate surface, and wherein said MIS contacts are covered with an insulating lamina containing electrical charges.

3. A solar cell according to claim 1, wherein the distance separating said ohmic contacts and said second surface of said semiconductive substrate is greater than the diffusion length of the minority charge carriers.

4. A solar cell according to claim 1, wherein the distance separating the outer surface of said second areas and said second surface of said semiconductive substrate is smaller than the diffusion length of the minority charge carriers.

5. A solar cell according to claim 1, wherein said first areas essentially determine the mechanical stability of said semiconductive substrate and have a trapezoidal, a rectangular or a curved cross-section.

6. A solar cell according to claim 1, wherein said first areas have peaks with said ohmic contacts arranged on said peaks, and said first areas exhibit a comb, grid or ring structure when viewed in plan.

7. A solar cell according to claim 6, wherein said ring structure is formed by concentrically arranged rings with radially running paths.

8. A solar cell according to claim 1, wherein said semiconductive substrate is a single-crystalline (100)- or (110)-orientated silicon or polycrystalline silicon or compound semiconductor.

9. A solar cell according to claim 1, wherein said first and/or second areas are textured at least outside the regions of said ohmic contacts.

10. A solar cell according to claim 1, wherein the distance between said ohmic contacts is greater than the distance between said second areas and said second surface of said semiconductive substrate.

11. A solar cell according to claim 10, wherein said ohmic contacts, when viewed in plan, exhibit a finger-like structure, whereby the spacing between the fingers lies between 1 mm and 5 mm and the width of said fingers is from 50 $\mu$m to 300 $\mu$m.

12. A solar cell according to claim 1 in the form of a silicon nitride inversion layer solar cell with a plurality of spaced apart MIS contacts lying opposite said ohmic contacts, and wherein the spacing between adjacent MIS contacts is as little as 1/50 of that between said ohmic contacts.

13. A solar cell according to claim 12, wherein the distance separating said MIS contacts is between 50 $\mu$m and 1 mm, and that between said ohmic contacts is between 1 mm and 5 mm.

14. A solar cell comprising:
a semiconductive substrate having first and second opposed major surfaces in which minority and majority charge carriers are generated by radiation energy, said charge carriers being separable and so dischargeable by an electrical field,
ohmic contacts arranged at intervals upon said first semiconductive substrate surface, said contacts being interlinked with one another, and
a passivation layer arranged at least between said ohmic contacts, and wherein
the electrical field separating the minority and majority charge carriers exists in the vicinity of said second semiconductive substrate surface positioned opposite said first semiconductive surface carrying said ohmic contacts so that the majority charge carriers diffuse to said ohmic contacts which collect said charge carriers, and
said ohmic contacts are arranged in first areas on said first semiconductive substrate surface, said first areas being elevated with respect to second areas which are located between said ohmic contacts.

15. A solar cell according to claim 14, wherein said passivation layer covers said ohmic contacts.

16. A solar cell according to claim 14, wherein the electrical field separating the minority and majority charge carriers is generated by MIS contacts formed on said second substrate surface, and wherein said MIS contacts are covered with an insulating lamina containing electrical charges.

17. A solar cell according to claim 14, wherein the distance separating said ohmic contacts and said second surface of said semiconductive substrate is greater than the diffusion length of the minority charge carriers.

18. A solar cell according to claim 14, wherein the distance separating the outer surface of said second areas and said second surface of said semiconductive substrate is smaller than the diffusion length of the minority charge carriers.

19. A solar cell according to claim 14, wherein said first areas essentially determine the mechanical stability of said semiconductive substrate and have a trapezoidal, a rectangular or a curved cross-section.

20. A solar cell according to claim 14, wherein said first areas have peaks with said ohmic contacts arranged on said peaks, and said first areas exhibit a comb, grid or ring structure when viewed in plan.

21. A solar cell according to claim 20, wherein said ring structure is formed by concentrically arranged rings with radially running paths.

22. A solar cell according to claim 14, wherein said semiconductive substrate is a single-crystalline (100)- or (110)-oriented silicon or polycrystalline silicon or compound semiconductor.

23. A solar cell according to claim 14, wherein said first and/or second areas are textured at least outside the regions of said ohmic contacts.

24. A solar cell according to claim 14, wherein the distance between said ohmic contacts is greater than the distance between said second areas and said second surface of said semiconductive substrate.

25. A solar cell according to claim 24, wherein said ohmic contacts, when viewed in plan, exhibit a finger-like structure, whereby the spacing between the fingers lies between 1 mm and 5 mm and the width of said figures is from 50 $\mu$m to 300 $\mu$m.

26. A solar cell according to claim 14, in the form a silicon nitride inversion layer solar cell with a plurality of spaced apart MIS contacts, lying opposite said ohmic contacts, and wherein the spacing between adjacent MIS contacts is as little as 1/50 of that between said ohmic contacts.

27. A solar cell according to claim 26, wherein the distance separating said MIS contacts is between 50 $\mu$m and 1 mm, and that between said ohmic contacts is between 1 mm and 5 mm.

* * * * *